United States Patent [19]
Cohen et al.

[11] Patent Number: 6,110,836
[45] Date of Patent: Aug. 29, 2000

[54] REACTIVE PLASMA ETCH CLEANING OF HIGH ASPECT RATIO OPENINGS

[75] Inventors: Barney M. Cohen, Santa Clara; Jingang Su, Sunnyvale; Kenny King-Tai Ngan, Freemont, all of Calif.

[73] Assignee: Applied Materials, Inc., Santa Clara, Calif.

[21] Appl. No.: 09/298,065

[22] Filed: Apr. 22, 1999

[51] Int. Cl.⁷ ........................................ H01L 21/00
[52] U.S. Cl. ........................ 438/710; 134/1.2; 216/67; 216/79; 438/719
[58] Field of Search ................... 134/1.2, 1.3, 2; 216/67, 77, 78, 79; 438/706, 710, 718, 719, 720, 723, 735, 742, 743

[56] References Cited

U.S. PATENT DOCUMENTS

| | | | |
|---|---|---|---|
| 4,951,601 | 8/1990 | Maydan et al. | 118/719 |
| 5,413,670 | 5/1995 | Langan et al. | 438/723 X |
| 5,662,814 | 9/1997 | Sugino | 438/719 X |
| 5,888,906 | 3/1999 | Sandhu et al. | 438/723 X |

*Primary Examiner*—William Powell
*Attorney, Agent, or Firm*—Birgit E. Morris

[57] ABSTRACT

Native oxides can be removed from a substrate having high aspect ratio openings therein by using a plasma gas precursor mixture of a reactive halogen-containing gas and a carrier gas such as helium. The lightweight ions generated in the plasma react with oxygen to produce very volatile oxygen-containing species that can be readily removed through the exhaust system of the plasma chamber, preventing re-deposition of oxides on the surface of the substrate or on the sidewalls or bottom of the openings. When the substrate is mounted in a plasma chamber having dual power sources that can form a plasma above the substrate and can apply bias to the substrate, tapered openings are formed rapidly that can be readily filled without forming voids.

17 Claims, 1 Drawing Sheet ically available as the Pre-Clean II chamber available from
REACTIVE PLASMA ETCH CLEANING OF HIGH ASPECT RATIO OPENINGS This invention relates to an improved method of removing native oxides. More particularly, this invention relates to removing native oxides from high aspect ratio openings.

BACKGROUND OF THE INVENTION

In the manufacture of semiconductor devices, in an attempt to provide more devices on a single semiconductor substrate, such as a silicon wafer, several layers of devices are made, separated by dielectric layers. Openings are made in the dielectric layers which are then filled with a conductive material to provide electrical contact between devices in different layers. Such openings are kept small, but they must go through comparatively thick dielectric layers. The ratio of depth to width is called the aspect ratio (AR) and small diameter, deep openings are referred to as high aspect ratio openings. As smaller devices are being made, the AR of such openings increases.

Native oxides are readily formed by exposure of the material at the bottom of the opening to even a very small amount of oxygen; the reaction is spontaneous to form a thin "native oxide" layer. Materials such as silicon, aluminum, copper and the like readily form native oxides from any oxygen that may be present in the chamber used to etch the opening; whether because of exposure of the substrate to air, or to any oxygen-containing species that may be generated during the etch step.

Since oxides are dielectrics, the oxidation of conductive materials such as silicon, aluminum or copper to form their oxides reduces the conductivity of the deposited conductive layer, and creates an interface having a high contact resistance with a subsequently deposited conductive film. This degrades the performance of devices. Thus, in order to prevent degradation of devices, the high aspect ratio openings must be cleaned of these native oxides prior to filling them with a conductive contact material.

Heretofore, native oxides have been removed with a pre-clean step, as by dipping the substrate in a buffered oxide etch, or "BOE" etchant, such as HF and ammonium fluoride, and/or by sputter etching with argon. After removal of the native oxide, however, the substrate cannot be exposed to any oxygen or oxygen-containing gases, or native oxide will re-form.

Thus a method for providing an effective preclean, or removal of native oxide in vacuum that will not re-deposit oxide in the bottom or along the sidewalls of high aspect ratio openings has been sought.

Further, such a method must be able to remove native oxides completely from the bottom of high aspect ratio openings, i.e., having an AR of 4 or higher, without re-depositing native oxide along the sidewalls of the opening.

SUMMARY OF THE INVENTION

The present invention provides a method for removing native oxides from the bottom of high aspect ratio openings without re-deposition, or depositing oxide-containing material along the sidewalls of the opening. This is accomplished by etching the bottom of high aspect ratio openings with a plasma that converts oxygen present in the chamber to volatile oxygen-containing or halogen-containing gases that can be rapidly and completely removed through the vacuum chamber exhaust system.

In particular, a plasma of helium and halogen-containing gases is formed in a suitable plasma etch chamber. This etchant mixture converts the native oxides present to elemental oxygen and volatile halogen-containing gases. These gases can be rapidly and completely exhausted from the chamber, preventing re-deposition of oxygen-containing compounds on the bottom or sidewalls of high aspect ratio openings. Since re-deposited material on the walls and fixtures of the etch chamber does not adhere well, eventually particles fall away from the walls and fixtures that can deposit on the substrate. Such re-deposition is also prevented by the present invention.

DETAILED DESCRIPTION OF THE INVENTION

Figure 1:
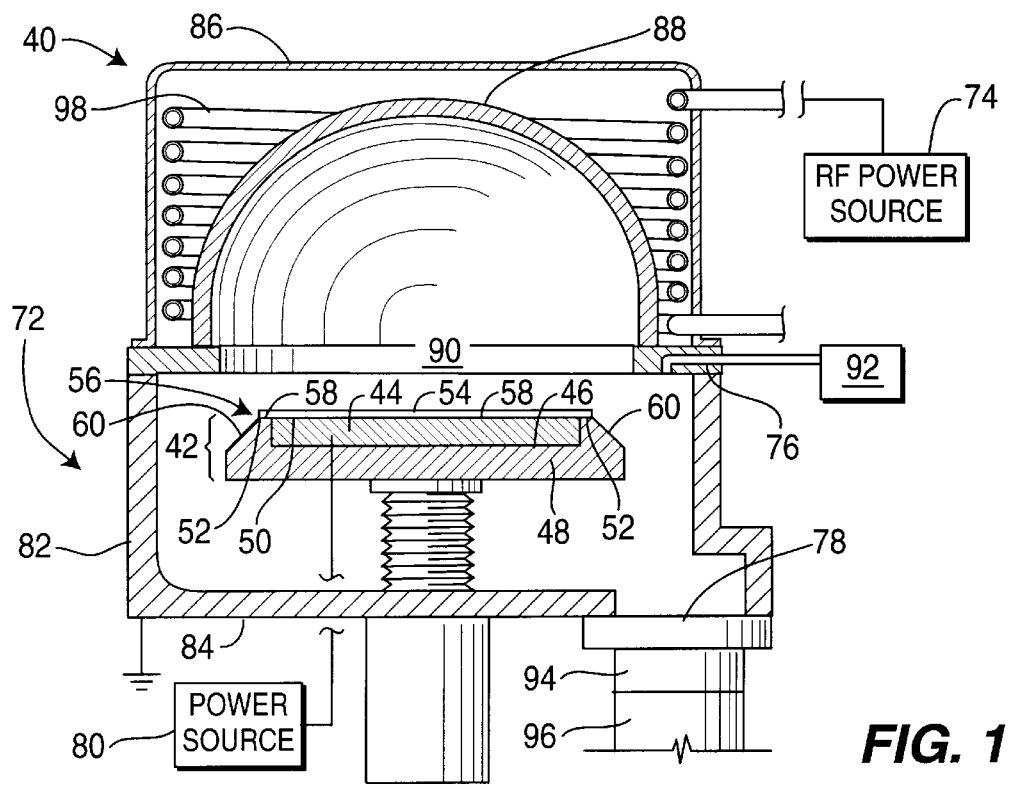
FIG. 1 is a cross sectional view of a plasma vacuum chamber in which the present cleaning step can be carried out.

The vacuum chamber useful herein is a dual-power etch chamber as shown in FIG. 1. This chamber is commercially available as the Pre-Clean II chamber available from Applied Materials, Inc. of Santa Clara, Calif. Generally, the etch/preclean chamber 40 comprises an enclosure 72, a substrate support 42 disposed within the chamber 40, a gas inlet 76 connected to the enclosure 72, a gas exhaust 78 connected to the enclosure 72, an RF power source 74 connected to an inductive coil 98 to generate a plasma within the enclosure 72 from gases passed into the chamber through the gas inlet 76, and a power source 80 connected to the substrate support 42.

The enclosure 72 includes sidewalls 82, a bottom 84 and a top 86. A replaceable alumina ($Al_2O_3$) dome 88 is mounted under the top 86 and above a processing region 90. An inductor coil 98 is disposed about the alumina dome 88 and is connected to the RF power source 74 to inductively couple a plasma within the processing region 90.

The gas inlet 76 is connected to a processing gas supply 92 and introduces the processing gas mixture into the chamber 40 during processing. The gas exhaust 78 preferably comprises a servo control throttle valve 94 and a vacuum pump 96. The vacuum pump 96 evacuates the chamber 40 prior to processing, and during processing, the vacuum pump 96 and the servo throttle valve 94 maintain the desired pressure within the chamber 40.

The substrate support member 42 generally comprises a pedestal plate 44 disposed within a recess 46 on a top surface of an alumina insulator plate 48. The top surface of the pedestal plate 44 extends slightly higher than the upper surface 52 of the insulator plate 48, and is in contact with a central portion of the bottom surface, or backside, 58 of the substrate 54. Preferably the pedestal plate 44 comprises alumina and it is connected to the power source 80 to provide a bias to the substrate 54. The peripheral portion of the substrate 54 extends above the upper annular surface 52 of the insulator plate 48 and forms a gap 56 between the bottom surface 58 of the substrate 54 and the upper surface 52 of the insulator plate 48. Preferably the gap 56 has a height between about 5 mils and about 15 mils to prevent the plasma from reaching the backside of the substrate 54. The outer edge of the surface 52 of the insulator plate 48 has a diameter at least as great as the diameter of the outer edge of the substrate 54 and the backside 58 so that the backside 58 is contacted to the pedestal plate 44.

A beveled portion 60 of the alumina insulator plate 48 extends from the outer edge of the upper plate surface 52 in a downward slope. Preferably, the slope of the beveled portion 60 is between about 10 to about 60 degrees from a horizontal plane. As shown in FIG. 1, the slope is about 45 degrees. optionally the substrate support 42 includes a temperature controller or a heater (not shown) to control the temperature of the substrate during processing.

In operation, the substrate 54 is positioned on the substrate support 42 and the chamber 40 is evacuated to provide a vacuum environment. A processing gas comprising helium as a carrier gas and a halogen-containing gas is introduced through the gas inlet 76 into the processing region 90. The gas flow rates of the reactive gases is adjusted as desired as will be further explained below.

To initiate the reaction, a plasma of the processing gas mixture is generated in the processing region 90 through inductive coupling and/or capacitive coupling. The initial plasma is struck by applying power to the substrate support 42 of between about 1 Watt and about 500 Watts, preferably between 50 and 300 Watts of power, using a frequency of between about 100 kHz to about 100 MHz for a short period of time, as about 3 seconds. The initial plasma can also be generated by applying power to the inductive coil 98. During processing, power of between about 1 Watt and about 1000 Watts, preferably from about 100 to 400 Watts, at a frequency of from between about 100 kHz to 60 MHz, sustains a plasma in the processing region 90 inductively. A plasma in the chamber 40 can be sustained by inductive coupling alone, by capacitive coupling alone, or preferably by a combination of the two.

The etch time is adjusted to remove the native oxide from the bottom of openings in the substrate. Removing about 100 to 500 angstroms of material from the bottom of the openings should remove all of the native oxide, but without sputtering any oxygen-containing species onto the sidewalls of the openings. If a barrier layer is used to line the openings prior to depositing a conductive layer, as is known, the presence of oxide on the sidewall would degrade the barrier layer and device quality.

The above PreClean II chamber can be used as part of a multi-chamber system that permits transfer of the substrate from one processing chamber to another without removing the substrate from vacuum, and thus exposure of the substrate to oxygen. Such a system is disclosed by Maydan et al in U.S. Pat. No. 4,951,601, which is incorporated herein by reference.

In accordance with the invention, a highly reactive etchant gas of a reactive halogen-containing gas mixed with a carrier gas such as helium, is employed to remove native oxides such as silicon oxide. Suitable reactive halogen-containing gases include nitrogen trifluoride, carbon tetrafluoride, sulfur hexafluoride, carbon tetrachloride, boron trichloride and the like. In the plasma region of the chamber as described above, the halogen-containing gas breaks up into lightweight ions and radicals which react rapidly with native oxides. The helium atoms also ionize in the plasma, providing increased excitation to the halogen-containing molecules and increasing their dissociation. The reactions that occur in the plasma between an etchant mixture of the invention, such as nitrogen trifluoride and helium, and silicon oxide, as one example, can be summarized in the reactions given below.

1) $NF_n + e \rightarrow NF_{n-1} + F-$
2) $F- + e- \rightarrow F + 2e-$
3) $4F + SiO_2 \rightarrow SiF_4\uparrow + O_2\uparrow$ Thus the overall reaction is:

4) $3SiO_2 + 4NF_3 \rightarrow 3SiF_4\uparrow + 2N_2\uparrow + 3O_2\uparrow$

Since the ions formed in the plasma from the etchant mixture are light in weight, little sputtering occurs and the preclean step operates by a reaction between the ions and radicals in the halogen-containing plasma and the silicon oxide on the substrate. The relative amount of reactive halogen-containing gas such as nitrogen trifluoride is kept low, generally below about 20 percent, to maintain a low etch rate and to prevent removal of more material than is necessary to remove the native oxide. Little sputtering occurs due to the light weight of the halogen-containing gases and helium molecules.

However, to further aid in the above process, the addition of a) argon or b) a mixture of hydrogen gas and argon, can reduce the oxide and/or sputter the oxide, aiding in its rapid reaction and removal from the bottom and sidewalls of very high aspect ratio openings.

The invention will be further illustrated by the following example, but the invention is not meant to be limited to the details described therein.

EXAMPLES

In a reactor as described in FIG. 1, a substrate of silicon having a native oxide layer thereover and having high aspect ratio openings of 12:1in the top surface thereof was exposed to a plasma formed from a mixture of 10% atomic concentration of nitrogen trifluoride and 90% atomic concentration of helium which was passed into the chamber at a flow rate of 50 sccm. The chamber pressure was 50 millitorr.

The bias to the substrate was varied and etching was continued to remove 500angstroms of material from the substrate. The time required to remove the oxide was measured. The results are summarized below in Table I.

TABLE I

| Example | Plasma/Bias (W) | Etch Amount, Å | Time, sec. |
| --- | --- | --- | --- |
| 1 | 300/300 | 500 | 52.2 |
| 2 | 200/400 | 500 | 47.5 |
| Control* | 300/300 | 500 | 93.5 |

*Argon gas alone

Thus using the reactive etchant mixture of the invention, the etch time was reduced almost by half, and the amount of material removed from the top of the openings and from the bottom of the openings was much more equal than when using a sputtering gas of argon as the etchant.

Figure 2:
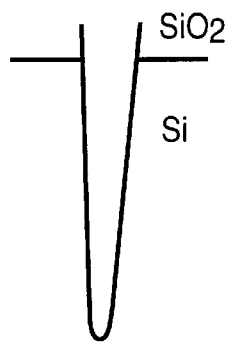
FIG. 2 illustrates a deep tapered opening cleaned in accordance with the invention.

FIG. 2 illustrated the tapered, cleaned opening formed in Example 1 and having a 12:1 AR with a depth of 2.8 microns and a diameter of 0.25 micron at the bottom of the opening. Because of this tapered shape, the openings can be filled with conductive material without the formation of voids.

It is apparent that all oxide or dielectric material was removed from the bottom of the opening, and there was no deposition of material on the sidewalls of the opening.

The amount of material in angstroms removed from the top surface of the substrate, called the field etch amount, and the amount of material removed from the bottom surface of the opening, called the bottom etch amount, were also measured for the above examples and control. The data are summarized below in Table II.

TABLE II

| Example | Field Etch Amount, Å | Bottom Etch Amount, Å |
|---------|---------------------|----------------------|
| 1 | 585 | 473 |
| 2 | 724 | 542 |
| Control | 613 | 78 |

Thus the etch removal at the bottom of the opening was much improved using the etchant mixture of the Examples.

Figure 3A:
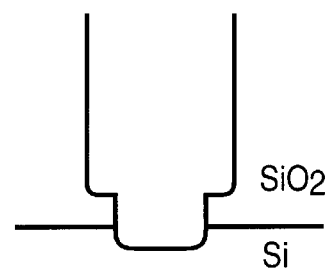
FIG. 3A illustrates an opening having native oxide at the bottom of the opening.

FIG. 3A illustrates a profile of an opening formed in silicon oxide as a Control.

Figure 3B:
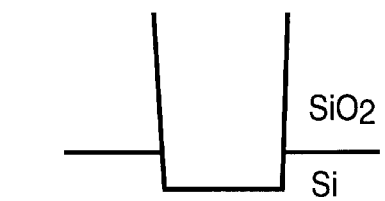
FIG. 3B illustrates a sputter etched opening in accordance with the prior art.

FIG. 3B illustrates a profile of an opening formed in silicon oxide and sputter etched to remove native oxides.

Figure 3C:
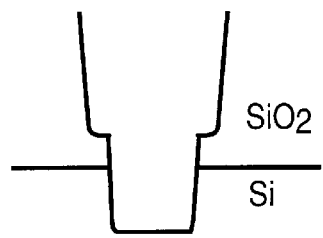
FIGS. 3C and 3D illustrate a reactively etched opening in accordance with the process of the invention.
Figure 3D:
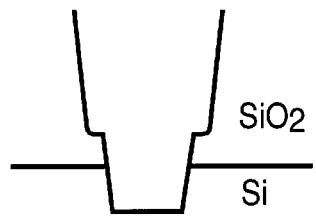

FIGS. 3C and 3D illustrate the reactively etched openings cleaned in accordance with the invention (Examples 1and 2 respectively). The tapered sidewalls of FIGS. 3C and 3D are much easier to fill with conductive material.

Although the invention has been described in terms of specific reaction chambers and reactive gases, one skilled in the art will realize that other pre-clean chambers and other etchant mixtures can be substituted, and are meant to be included herein.

We claim:

1. A method for removing native oxide material from the bottom of high aspect ratio contact openings which comprises etching the openings with a reactive plasma formed from a precursor mixture of halogen-containing gas and a carrier gas in a vacuum chamber to form lightweight oxygen-containing reaction products, and exhausting the oxygen-containing reaction products from the chamber.

2. A method according to claim 1 wherein the halogen-containing gas is selected from the group consisting of nitrogen trifluoride, carbon tetrafluoride, sulfur hexafluoride, carbon tetrachloride, and boron trichloride.

3. A method according to claim 2 wherein the halogen-containing gas is nitrogen trifluoride.

4. A method according to claim 1 wherein the plasma is formed from about 1 to about 50 atomic percent of a halogen-containing gas in a helium carrier gas.

5. A method according to claim 1 wherein the plasma precursor gases further include hydrogen.

6. A method according to claim 3 wherein the plasma precursor gases further include argon.

7. A method of removing native oxide material from the bottom of high aspect ratio contact openings which comprises a) mounting a substrate having high aspect ratio openings therein on a substrate support in a plasma chamber fitted with an external coil connected to a source of RF power to generate a plasma in the plasma chamber, a source of power connected to the substrate support to provide bias to the substrate, and an exhaust system;

b) passing a plasma precursor gas mixture to the chamber comprising a mixture of a halogen-containing gas and a carrier gas; and c) exhausting oxygen-containing reaction products from the chamber.

8. A method according to claim 7 wherein the halogen-containing gas is selected from the group consisting of nitrogen trifluoride, carbon tetrafluoride, sulfur hexafluoride, carbon tetrachloride and boron trichloride.

9. A method according to claim 8 wherein the halogen-containing gas is nitrogen trifluoride.

10. A method according to claim 7 wherein the carrier gas is helium.

11. A method according to claim 7 wherein the bias power applied is between about 1 and 500 watts.

12. A method according to claim 7 wherein the RF power applied to the coil is between about 1 and 1000 watts.

13. A method according to claim 10 wherein the plasma precursor gas mixture further includes hydrogen.

14. A method according to claim 10 wherein the plasma precursor gas mixture further includes argon.

15. A method according to claim 7 wherein the plasma precursor gas mixture further includes argon.

16. A method of removing native oxide material from the bottom of high aspect ratio contact openings which comprises a) mounting a substrate having high aspect ratio openings therein on a substrate support in a plasma chamber fitted with an external coil connected to a source of RF power to generate a plasma in the plasma chamber, a source of power connected to the substrate support to provide bias to the substrate, and an exhaust system;

b) passing a plasma precursor gas mixture to the chamber comprising a mixture of nitrogen trifluoride and helium, c) applying from 50 to 300 watts of power to the substrate support and from 100 to 400 watts of power to the external coil to form a plasma in the chamber, and d) exhausting oxygen-containing reaction products from the chamber.

17. A method according to claim 16 wherein the nitrogen trifluoride concentration in helium is from 1 to about 50 percent.

* * * * *